United States Patent
Quintens et al.

(10) Patent No.: US 6,460,957 B1
(45) Date of Patent: Oct. 8, 2002

(54) USE OF AN INK JET IMAGE AS PREPRESS INTERMEDIATE

(75) Inventors: Dirk Cyriel Quintens, Westerloo; Leo Oelbrandt, Kruibeke; Marc Graindourze, Overpelt, all of (BE)

(73) Assignee: Agfa-Gevaert, Mortsel (BE)

( * ) Notice: Subject to any disclaimer, the term of this patent is extended or adjusted under 35 U.S.C. 154(b) by 0 days.

(21) Appl. No.: 09/401,900

(22) Filed: Sep. 23, 1999

Related U.S. Application Data

(60) Provisional application No. 60/113,338, filed on Dec. 22, 1998.

(30) Foreign Application Priority Data

Aug. 10, 1998 (EP) .............................. 98203410

(51) Int. Cl.[7] ................. B41J 3/00; B41J 2/01
(52) U.S. Cl. ............................. 347/2; 347/101
(58) Field of Search ........................... 347/2, 101, 105; 101/457; 428/195

(56) References Cited

U.S. PATENT DOCUMENTS

| | | | | |
|---|---|---|---|---|
| 5,190,805 A | * | 3/1993 | Atherton et al. | 347/105 |
| 5,637,426 A | | 6/1997 | Uchikawa | 430/9 |
| 5,950,542 A | * | 9/1999 | Harris et al. | 101/457 |
| 5,984,467 A | * | 11/1999 | Bodager et al. | 347/105 |

FOREIGN PATENT DOCUMENTS

| | | | | |
|---|---|---|---|---|
| EP | 0 701 902 | | 3/1996 | |
| EP | 0 829 375 | | 3/1998 | |
| GB | 2141639 | | 1/1985 | |
| GB | 2141639 A | * | 1/1986 | B32B/33/00 |
| JP | 01146784 | | 8/1989 | |

* cited by examiner

*Primary Examiner*—John Barlow
*Assistant Examiner*—Manish S Shah
(74) *Attorney, Agent, or Firm*—Joseph T. Guy; Nexsen Pruet Jacobs & Pollard, LLC

(57) ABSTRACT

An image which is produced by jetting a liquid pigmented ink to a receiving layer having a N-containing polymer as binder, preferably gelatin, is useful as master for the exposure of a printing plate.

16 Claims, No Drawings

USE OF AN INK JET IMAGE AS PREPRESS INTERMEDIATE

This application claims the benefit of provisional application No. 60/113,338, filed Dec. 22, 1998.

FIELD OF THE INVENTION

The present invention relates to the production of an ink jet image for use in graphic arts prepress.

BACKGROUND OF THE INVENTION

In graphic arts reproduction processes the original image appearing to have a continuous tone gradation is reproduced by a collection of a large number of dots and/or lines. The tone of the reproduced image is influenced by both the size of the dots and/or lines and their density. The technique by which each particular area of a continuous tone original is broken up into a large number of small dots is called screening. The obtained image is called a halftone image.

In a commonly used halftone screening technique, the continuously changing tone values of the original are modulated with periodically changing tone values of a superimposed two-dimensional screen. The modulated tone values are then subject to a thresholding process wherein tone values above the treshold value will be reproduced and those below will not be reproduced. The process of tone-value modulation and thresholding results in a two-dimensional arrangement of equally spaced "screen dots" whose dimensions are proportional to the tone value of the original at that particular location. The number of screen dots per unit distance determines the screen frequency or screen ruling. This screening technique wherein the screen frequency is constant and inversely proportional to the halftone elementary cell size is referred to as amplitude-modulation screening or autotypical screening. This technique can be implemented photo-mechanically or electronically.

The photo-mechanical implementation involves an analog process wherein a screen of equally spaced dots is physically superimposed, in contact or in projection with the original. Screen dots are formed when this combination is photographically reproduced in a system wherein thresholding is achieved through the use of special photographic films and developing chemicals producing a very high photographic contrast resulting in a sharp distinction between tone values above and below a certain level.

The electronic implementation of autotypical screening is a digital process whereby the continuous tone values of the original are broken up into discrete tone-value levels, specified at discrete areal coordinates within the original image. Each tone value is compared with an electronic threshold level, and values above the threshold are reproduced while those below the threshold are not. Screen dots are formed when a specific pattern of threshold values is defined in a two-dimensional array corresponding to the size of a halftone cell, and this threshold pattern is periodically applied across the image.

It will further be clear that in order to reproduce a color image using lithographic printing it will be required to separate the image in three or more part-images corresponding to primary colors which when printed over each other yield the desired color at any place within the image. Each of these colour separations has to be screened as described above.

When using conventional amplitude modulation halftoning some unwanted artifacts can occur in the reproduced photographic image and hence also in the final print for which the photographic film serves as intermediate. Without going into further detail effects called subject Moiré, colour Moiré, and micro Moiré or "rosette" can occur. These artefacts can be avoided by using an alternative technique, called frequency modulation screening.

Frequency modulation screening, also called stochastic screening, is a technique in which the continuously changing tone values of an original are reproduced by means of equally sized micro dots, the number of which, not the size, is proportional to the tone value of the original image. The name frequency modulation refers to the fact that the number of micro dots per unit surface (the frequency) fluctuates in relation to the tone value in the corresponding area of the original. A commercial implementation of frequency modulation screening is CrystalRaster, registered trade name of Agfa-Gevaert N.V.

The dots and lines of screened images must exhibit sufficient high density since no substantial amount of light may be transmitted trough the dots and lines in a further exposure cycle. Therefore, a photographic element with high gradation is required. Furthermore the dots must exhibit a well-shaped form and sharp edges. This most desired combination of high contrast and excellent dot quality is commonly termed "lith quality". The goal of achieving optimal lith quality is reached, in conventional photographic prepress, by the combination of so-called specially designed photographic materials and appropriate processing systems. A first group of such processing systems consists of the traditional "lith developers" characterized by the presence of hydroquinone as the sole developing agent and a low but critical sulphite ions content giving rise to an infectious development mechanism. However these conventional lith developers are rather instable in time and require complicated replenishment systems for both oxidation and exhaustion. Furthermore their developing capacity is rather limited due to the fact that they contain hydroquinone as the sole developing agent. Therefore, some 10–15 years ago so-called "hybrid systems" or "hard dot Rapid Access" developers were introduced on the market combining a good stability and lith quality in the reproduction of lines and screen dots. Examples of such developers and corresponding appropriate photographic materials include the GRANDEX system, marketed by Fuji Photo Co., AGFASTAR, marketed by Agfa-Gevaert N.V., and the ULTRATEC system, marketed by Eastman Kodak Co. However, this type of developers had a rather high pH and was more or less corrosive to the processing tank. In still more recent years hard dot systems were conceived wherein the developer more and more resembles a conventional Rapid Accesss developer as to pH and composition. Examples are the Kodak RA 2000 system, the Fuji HD system, and the IMPOWER system developed by the former prepress division of DuPont, now owned by Agfa-Gevaert AG.

When the screen dots are recorded electronically from digitally stored information a Rapid Access developing system will be adequate in most cases for obtaining sufficient dot quality provided the laser exposure source of the image-setter is of high quality and able to write screen dots with strong geometrical precision. A suitable image-setter is the AVANTRA, marketed by Agfa-Gevaert N.V., and a suitable recorder film is ALLIANCE HN, marketed by the same company.

Photomechanically or electronically produced halftone images are used as a master for the direct exposure of a printing plate, e.g. a planographic printing plate, or for the exposure of a photographic intermediate such as a contact film.

It will be clear that the photographic production of halftone images brings along a complicated and expensive work flow. The use of expensive exposure devices, films and chemicals is inevitable. Furtheron, the use of processing chemicals is ecollogically suspect according to modern standards. As a consequence, a cumbersome and expensive disposal procedure is needed. An alternative to the photographic method would be welcome.

OBJECTS OF THE INVENTION

It is the object of the present invention to provide an alternative system for the production of an image which can serve as a master for the exposure of a printing plate or intermediate contact film, or printed circuit board (PCB) precursor, said system being simple, inexpensive and involving no wet processing steps.

SUMMARY OF THE INVENTION

The above mentioned objects are realised by providing a method for the production of a UV sensitive printing plate, said method comprising exposing said plate through a screened image, or through an intermediate which itself is exposed through said screened image, said image having a full area Dmax of at least 3.5 in the ultra-violet spectral region, characterized in that said image has been obtained by jetting information-wise an ink composition containing a pigment to a receiver element, said element comprising a transparent support and a receiving layer having as binder at least one N-containing polymer, preferably gelatin.

DETAILED DESCRIPTION OF THE INVENTION

In ink jet printing tiny drops of ink fluid are ejected directly onto an ink receptor surface without physical contact between the printing device and the receptor. The printing device stores the printing data electronically and controls a mechanism for ejecting the drops image-wise. Early patents on ink jet printers include U.S. Pat. Nos. 3,739,393, 3,805,273 and 3,891,121.

The jetting of the ink droplets can be performed in several different ways. In the early 1960s, Dr. Sweet of Stanford University demonstrated that by applying a pressure wave pattern to an ink stream which is jetted continuously through a small nozzle. This ink stream could be broken in droplets which are uniform in size and spacing. The droplet stream is image-wise divided into droplets that are electrostatically charged and deflected, and into droplets that remain uncharged and continue their way undeflected. This process is known as continuous ink jet printing. In one embodiment the uncharged undeflected droplet stream forms the image while the charged deflected stream is recollected. Alternatively, the charged deflected stream forms the image and the uncharged undeflected jet is recollected. In a variant of this system several jets are deflected to a different degree and thus record the image (multideflection system). Sweet's invention led to the introductions of A. B. Dick VideoJet and the Mead DIJIT products. In the 1970s IBM licensed the technology and adapted it for their computer printers. At approximately the same time, Prof. Hertz of the Lund Institute of Technology in Sweden and his associates independently developed several continuous ink jet techniques that had the ability to modulate the ink flow characteristics for gray-scale printing by controlling the number of drops deposited in each pixel. This method was licensed to companies such as Iris Graphics/Scitex and Stork to produce high-quality colour images.

As an alternative for continuous ink jet the ink droplets can be created "on demand" ("DOD" or "drop on demand" method) whereby the printing device ejects the droplets only when they are used in imaging on a receiver thereby avoiding the complexity of drop charging and deflection hardware. In drop-on-demand the ink droplet can be formed by means of a piezoelectric transducer (so-called "piezo method"), or by means of discrete thermal pushes (so-called "bubble jet" method, or "thermal jet" method). Zoltan, Kyser and Sears are the pioneers of the first method. In these printers, on the application of voltage pulses, ink drops are ejected by a pressure wave created by the mechanical motion of a piezoelectric ceramic. In 1979, Endo and Hara of Canon Co. invented a drop-on-demand ink jet method wherein ink drops were ejected from a nozzle by the growth and collapse of a water vapor bubble on the top surface of a small heater located near the nozzle. Canon called the technology the bubble jet. During the same time period or shortly thereafter Hewlett-Packard developed a similar ink jet technology, commercialized in 1984 in the Thinkjet printer. They named the technology thermal ink jet.

In graphic arts, system are disclosed whereby specific ink compositions are jetted to transparent materials further used as photomasks, e.g. in U.S. Pat. No. 5,495,803, EP 737722, and WO 97/25206.

We will now describe in detail the different ingredients of the receiver material and the ink composition according to the invention.

Description of the Receiver Material

An essential feature of the present invention is the fact that the binder of the receiving layer is a N-containing polymer. Farout the most preferred binder is gelatin. The advantages of gelatin are the facts that it forms a clear coating, is readily cross-linked in an easily controllable manner, and is highly absorptive of water-based liquid inks thereby providing rapid drying characteristics. Other N-containing binders can be chosen from a large variety of chemical compounds including e.g. polyvinyl pyrrolidone (PVP), polyacrylamide, acrylamide/acrylic acid, poly(2-acrylamido-2-methyl propane sulphonic acid), poly (diethylene triamine-co-adipic acid), polyvinyl pyridine, polyvinyl imidazole, polyimidazoline quaternized, polyethylene imine, polyethylene imine epichlorohydrine modified, polyethylene imine ethoxylated, poly(N,N,-dimethyl-3,5-dimethylene piperidinium chloride, polyurethane, melamin resins, urea resins, nitrile rubbers, albumin.

More than one N-containing polymer can be present in the receiving layer. In a preferred embodiment gelatin is mixed with polyvinyl pyrrolidone (PVP). Preferably the gelatine is present in an amount between 60 and 100% of weight, while PVP is present in an amount between 40 and 0% of the binder mixture.

In principle, although not being a preferred embodiment, a non-N-containing binder may also be present in the receiving layer, e.g. cellulose derivatives such as carboxymethyl cellulose, hydroxyethyl cellulose, hydroxypropyl cellulose, hydroxypropyl methyl cellulose; starch, dextran; polyvinyl alcohol, polyvinyl alcohol derivatives such as acetoacetylated derivatives, polyvinyl acetate, polyvinyl acetal, polyalkyleneoxides, latices such as copoly(styrene-butadiene), carboxylated polymers, polyacrylates, etc.

The receiving layer can further contain fillers, pigments, whitening agents and porous particulate material. Inorganic materials include e.g. synthetic silica, talc, clay, koalin, diatomaceous earth, calcium carbonate, magnesium carbonate, aluminium hydroxide, aluminium oxide, boehmite and pseudo-boehmite, titanium oxide, zinc oxide, barium sulfate, calcium sulfate, zinc sulfide, satin white, aluminium silicate, calcium silicate, lithopone, etc. Organic materials include e.g. polystyrene, polymethacrylate, polymethylmethacrylate, elastomers, ethylene-vinylacetate copolymers, polyesters, polyester-copolymers, polyacrylates polyvinylethers, polyamides, polyolefines, polysilicones, guanamine resins, polytetrafluoroethylenes, elastomeric styrene-butadiene rubber (SBR), elastomeric butadiene-acrylonitrile rubber, urea resins, urea-formalin resins, etc. Pigments and particles have also been described in patent applications DE 2,925,769, GB 2,050,866, U.S. Pat. Nos. 4,474,850, 4,547,405, 4,578,285, WO 88 06532, U.S. Pat. No. 4,849,286, EP 339 604, EP 400 681, EP 407 881, EP 411 638 and U.S. Pat. No. 5,045,864.

Further typical and useful ingredients of ink jet receiver layers are so-called mordanting agents which by fixing the colorant of the jetted ink composition strongly improve the waterfastness of the finished image. Such mordant are usually (co)polymers containing cationic functions such as quaternary ammonium groups, fosfonium, sulfonium, and guadinium groups. Examples of such disclosures include U.S. Pat. Nos. 4,371,582, 4,575,465, 4,649,064, GB 2210071, EP 423829, DE 3109931, U.S. Pat. No. 4,585,724, EP 295338, EP 306564, U.S. Pat. No. 5,314,747, EP 609930, WO 94/20304, WO 94/20305, WO 94/20306, EP 615853, EP 615884, EP 618214, Also inorganic mordants have been described e.g. in U.S. Pat. No. 5,560,996, EP 704316, EP 754560.

The ink receiving layer according to this invention may be cross-linked to provide such desired features as waterfastness and non-blocking characteristics. The cross-linking is also useful in providing abrasion resistance and resistance to the formation of fingerprints on the element as a result of handling. There are a vast number of known cross-linking agents, also known as hardening agents that can be used individually or in combination and in free or in blocked form. Useful hardeners include formaldehyde and free dialdehydes, such as succinaldehyde and glutaraldehyde, blocked dialdehydes, active esters, sulfonate esters, active halogen compounds, s-triazines and diazines, epoxides, active olefins having two or more active bonds, carbodiimides, isoxazolium salts unsubsituted in the 3-position, esters of 2-alkoxy-N-carboxy-dihydro-quinoline, N-carbamoyl and N-carbamoylpyridinium salts, hardeners of mixed function, such as halogen-substituted aldehyde acids (e.g. mucochloric and mucobromic acids), onium substituted acroleins and vinyl sulfones and polymeric hardeners, such as dialdehyde starches and copoly (acroleinmethacrylic acid). A preferred class of hardeners are polyfunctional aziridines.

The ink-receiving layer of the present invention can also comprise a plasticizer such as ethylene glycol, dietylene glycol, propylene glycol, polyethylene glycol, glycerol monomethylether, glycerol monochlorohydrin, ethylene carbonate, propylene carbonate, tetrachlorophthalic anhydride, tetrabromophthalicanhydride, urea phosphate, triphenylphosphate, glycerolmonostearate, propylene glycol monostearate, tetramethylene sulfone, N-methyl-2-pyrrolidone, N-vinyl-2-pyrrolidone, and polymer latices with low Tg value such as polyethylacrylate, polymethylacrylate, etc.

Surfactants may be incorporated in the ink-receptive layer of the present invention. They can be any of the cationic, anionic, amphoteric, and nonionic ones as described in JP-A 62-280068 (1987). Examples of the surfactants are N-alkylamino acid salts, alkylether carboxylic acid salts, acylated peptides, alkylsulfonic acid salts, alkylbenzene and alkylnaphthalene sulfonic acid salts, sulfosuccinic acid salts, olefin sulfonic acid salts, N-acylsulfonic acid salts, sulfonated oils, alkylsulfonic acid salts, alkylether sulfonic acid salts, alkylallylethersulfonic acid salts, alkylamidesulfonic acid salts, alkylphosphoric acid salts, alkyletherphosphoric acid salts, alkylallyletherphosphoric acid salts, alkyl and alkylallylpolyoxyethylene ethers, alkylallylformaldehyde condensed acid salts, blocked polymers having polyoxypropylene, polyoxyethylene polyoxypropylalkylethers, polyoxyethyleneether of glycolesters, polyoxyethyleneether of sorbitanesters, polyoxyethyleneether of sorbitolesters, polyethyleneglycol aliphatic acid esters, glycerol esters, sorbitane esters, propyleneglycol esters, sugaresters, fluoro $C_2$–$C_{10}$ alkylcarboxylic acids, disodium N-perfluorooctanesulfonyl glutamate, sodium 3-(fluoro-$C_6$–$C_{11}$-alkyloxy)-1-$C_3$–$C_4$ alkyl sulfonates, N-[3-(perfluorooctanesulfonamide)-propyl]-N, N-dimethyl-N-carboxymethylene ammonium betaine, fluoro-$C_{11}$–$C_{20}$ alkylcarboxylic acids, perfluoro $C_7$–$C_{13}$ alkyl carboxylic acids, perfluorooctane sulfonic acid diethanolamide, Li, K and Na perfluoro $C_4$–$C_{12}$ alkyl sulfonates, N-propyl-N-(2-hydroxyethyl)perfluorooctane sulfonamide, perfluoro $C_6$–$C_{10}$ alkylsulfonamide propyl sulfonyl glycinates, bis-(N-perfluorooctylsulfonyl-N-ethanolaminoethyl)phosphonate, mono-perfluoro $C_6$–$C_{16}$ alkyl-ethyl phosphonates, and perfluoroalkylbetaine.

The receiving layer can further contain a so-called "spacing agent" which is used here as equivalent to matting agent" or "roughening agent". Useful roughening agents include following:

different types of silica such as disclosed e.g. in U.S. Pat. Nos. 3,084,131, 4,892,591, 4,902,568, EP 379964, EP 423829, U.S. Pat. No. 5,165,973, EP 739747, EP 781666, EP 803374, EP 862510, Wo 97/20691 starch or modified starch particles such as disclosed in EP 445327, EP 480362, EP 524635;

the spherical polymeric beads disclosed in U.S. Pat. No. 4,861,818;

the alkali-soluble beads of U.S. Pat. No. 4,906,560 and EP 0 584 407;

the insoluble polymeric beads disclosed in EP 0 466 982;

polymethylmethacrylate beads;

copolymers of methacrylic acid with methyl- or ethyl-methacrylate

TOSPEARL siloxane particles (e.g. types T105, T108, T103, T120), marketed by Toshiba Co;

SEAHOSTAR polysiloxane—silica particles (e.g. type KE-P50), marketed by Nippon Shokubai Co;

EPOSOAR MA particles; these are polymethylmethacrylate (PMMMA) X-linked (e.g. MA 1002, MA 1004);

SOKEN PEARL: spherical PMMMA micro powders (AS series: e.g. AS 15, 22, 30, 50, 65);

ROPAQUE particles, being polymeric hollow spherical core/sheat beads, marketed by Rohm and Haas Co, and described e.g. is U.S. Pat. Nos. 4,427,836, 4,468,498 and 4,469,825;

ABD PULVER, marketed by BASF AG;

CHEMIPEARL, spherical poymeric particles, marketed by Misui Petrochemical Industries, Ltd.;

particles coated with a water-repellent material such as disclosed in U.S. Pat. No. 5,204,233;

polymer particles having a reactive functional group capable of forming a covalent bond with a hardener or a binder, as disclosed in U.S. Pat. No. 5,057,407;

fluorine containing polymer pearls as described in EP 281928;

polymer particles prepared by suspension polymerisation as described e.g. in U.S. Pat. No. 5,342,733;

particles containing two polymers prepared as described by the method of EP 399729;

polystyrene beads prepared as disclosed in EP 341200;

gelatin-grafted polymer matting agents according to EP 307855.

When the receiver element has a backing layer the spacing agent is preferably incorporated in this backing layer.

A preferred type of matting agent is a hydrophobic modified starch. An example of such a modified starch is commercialized under the trade name "DRY FLO" by Roquette National Chimie. It is a starch ester containing hydrophobic groups. Its average particle diameter (median) according to volume is comprised between 13 and 20 $\mu$m.

The receiving layer of the receiver material of the present invention may consist of just one single layer or can be coated as a multiple layer pack, e.g. a double layer. The support may be coated on just one side with the receiving layer or layer pack or it may be coated double-side with said layer or layer pack.

Useful transparent organic resin supports for the receiver element include e.g. cellulose nitrate film, cellulose acetate film, polyvinylacetal film, polystyrene film, polyethylene terephthalate film, polycarbonate film, polyvinylchloride film or poly-α-olefin films such as polyethylene or polypropylene film. The thickness of such organic resin film is preferably comprised between 0.05 and 0.35 mm. In a most preferred embodiment of the present invention the support is a polyethylene terephthalate film provided with at least one subbing layer. This subbing layer can be applied before or after stretching of the polyester film support. The polyester film support is preferably biaxially stretched at an elevated temperature of e.g. 70–120° C., reducing its thickness by about ½ to ⅑ or more and increasing its area 2 to 9 times. The stretching may be accomplished in two stages, transversal and longitudinal in either order or simultaneously. The subbing layer, when present, is preferably applied by aqueous coating between the longitudinal and transversal stretch, in a thickness of 0.1 to 5 $\mu$m. This subbing layer preferably contains a homopolymer or copolymer of a monomer comprising covalently bound chlorine. Examples of said homopolymers or copolymers suitable for use in the subbing layer are e.g. polyvinyl chloride, polyvinylidene chloride, a copolymer of vinylidene chloride, an acrylic ester and itaconic acid, a copolymer of vinyl chloride and vinylidene chloride, a copolymer of vinyl chloride and vinyl acetate, a copolymer of butylacrylate, vinyl acetate and vinyl chloride or vinylidene chloride, a copolymer of vinyl chloride, vinylidene chloride and itaconic acid, a copolymer of vinyl chloride, vinyl acetate and vinyl alcohol etc. Polymers that are water dispersable are preferred since they allow aqueous coating of the subbing layer which is ecologically advantageous.

A second subbing layer may be present which is usually more hydrophilic and contains e.g. gelatin and an adhesion promoting polymer.

The support may be a mono-component layer or can consist of blend, or of a laminate of different materials manufactured by means of coextrusion.

Description of the Ink Composition

Ink compositions for ink jet typically include following ingredients: dyes or pigments, water and/or organic solvents, humectants such as glycols, detergents, thickeners, polymeric binders, preservatives, etc. It will be readily understood that the optimal composition of such an ink is dependent on the ink jetting method used and on the nature of the substrate to be printed. The ink compositions can be roughly divided in:

water based; the drying mechanism involves absorption, penetration and evaporation;

oil based; the drying involves absorption and penetration;

solvent based; the drying mechanism involves primarely evaporation;

hot melt or phase change the ink vehicle is liquid at the ejection temperature but solid at room temperature; drying is replaced by solidification;

radiation curable, e.g. UV-curable; drying is replaced by polymerization.

It will be readily understood that the first two types of ink compositions require a receiving medium that is more or less absorptive. On the contrary, for non-absorbent substrates solvent inks, hot melt inks or radiation-curable inks will be better suited.

According to the present invention combinations of liquid inks, preferably water-based inks are used.

Early patents on water-based inks include U.S. Pat. Nos. 3,903,034, 3,889,269, 3,870,528, 3,846,141, 3,776,742 and 3,705,043.

Typically water-based inks contain about 75–90 weight % of water. In order to avoid dry tipping on the orifice they contain a so-called humectant or mixtures of humectants which usually are (poly)alcohols. Suitable humectants include glycols such as diethyleneglycol, glycerine and polyethyleneglycol, N-methyl-pyrrolidone, 2-pyrrolidone, N-methyl-2-pyrrolidone, isopropanol, and 1,2-dimethyl-2-imidazolidone. Certain humectants such as N-methyl-pyrrolidone and 2-pyrrolidone have been found to improve the solubility of the colorant in the ink and thus serve the dual role as humectant and as cosolvent. Typically these humectants are present in a concentration ranging from 5 to 15%.

Apart from the colorant, water and humectant water-based ink compositions may contain in minor amounts further ingredients such as surfactants, biocides, buffering agents, chelating agents and defoaming agents.

Preferably the ink composition used in the process of the present invention consists of a concentrated black pigmented ink. Preferably the black pigment is carbon black in a concentration of at least 2%, preferably about 5%. Multiple types of inks containing carbon black are commercially available. They include carbon blacks such as Regal 400R, Mogul L, Elftex 320 from Cabot Co., or Carbon Black FW18, Special Black 250, Special Black 350, Special Black 550, Printex 25, Printex 35, Printex 55, Printex 150T from Degussa Co., and Pigment Black 7.

Furtheron the pigment may be chosen from those disclosed in *Industrial Organic Pigments, Production, Properties, Applications,* second edition, W. Herbst, K. Hunger; VCH, 1997. Additional examples of suitable pigments are disclosed in, for example, U.S. Pat. Nos. 5,389, 133 and 5,713,988.

The pigment particles should be sufficiently small to permit free flow of the ink through the ink jet printing device, especially at the ejecting nozzles that usually have a diameter ranging from less than 10 microns to 50 microns. The pigment particle size also has an influence on the pigment dispersion stability, which is critical throughout the life of the ink. It is also desirable to use small particles for maximum color strength.

Accordingly, the average particle diameter may be from about 0.005 $\mu$m to about 15 $\mu$m. Preferably, the pigment particle size may range from about 0.005 to about 5 μm, more preferably from about 0.005 to about 1 μm, and most preferably from about 0.005 to about 0.3 μm. Pigment particle sizes outside these ranges may, of course, be used so long as the objectives of the present invention are achieved. Very fine dispersions of pigments and methods for their preparation are disclosed in e.g. EP 0 776 952, U.S. Pat. Nos. 5,538,548, 5,443,628, EP 0 259 130, U.S. Pat. No. 5,285,064, EP 0 429 828, and EP 0 526 198.

When the pigment chosen is not in itself sufficiently absorptive in the UV spectral region it is preferred to add a UV absorbing dye to the ink composition. Suitable UV absorbers are disclosed e.g. in EP 0 252 550, U.S. Pat. Nos. 4,311,787, 4,082,554, 4,053,315, EP 0 519 306, EP 0 524 593, EP 0 524 594, EP 0 529 737, JP-A 03-38636, JP-A 03-13936, JP-A 03-41442, DE 4142935, EP 0 552 010, JP-A 03-48234, U.S. Pat. No. 5,155,015, EP 0 525 445, WO 93/5443, JP-A 03-78741, WO 93/13458, U.S. Pat. No. 4,923,788, EP 0 411 819, JP-A 61-205934, JP-A 01-259358, JP-A 02-73343, JP-A 02-71261 and EP 0 495 406. Still other UV absorbers are mentioned in *Research Disclosure,* December 1989, Item 309119, Section VIII.

Even when the pigment itself is a good UV absorber, as it is the case with carbon black, it is useful to add a UV absorber in order to enhance the UV density of the finished ink jet image. By doing so the use of very high concentrations of carbon black which potentially could lead to sendimentation and nozzle clogging can be avoided.

Description of Applications

The jetting of the pigmented ink to the receiver element both used in connection with the present invention can be performed by any type of ink jet printer, such as the different types of continuous ink jet printers or drop-on-demand ink jet printers as explained above. The production of a halftone image and its quality evaluation will be explained in the examples section.

The obtained screened ink jet image can be used as master for the exposure of any kind of UV-sensitive printing plate, e.g. presensitized offset printing plates, such as OSAZOL, (registered trademark of Agfa, OPS division), flexographic printing plates, and silkscreen printing materials.

In an alternative embodiment of the present invention a line pattern image consisting of lines having a UV density of at least 3.5 instead of a screened image is generated, e.g. by means of CAD (Computer Aided Design), and printed by ink jet. Such a line pattern image can then be used as master for the exposure of a printed circuit board (PCB) precursor. Such a PCB precursor is usually a photopolymerizable element the non-exposed parts of which are removed afterwards. The processed PCB precursor is then further used in the etching step of PCB manufacturing. The preferred embodiments of this alternative embodiment are the same as for the exposure of a printing plate through a screened image.

The receiver element as described in accordance with the present invention can also be used as recording element for an ink jet line pattern emanating from seismographic data or well logging data. Seismographic events can occur naturally during earthquakes or can be generated artificially, e.g. in geological exploration and engineering. However, in this application the ink jet image is the final image which is inspected visually. Therefore, a high density of the recorded lines in the visual region is of uttermost importance. Pigments such as carbon black are capable of producing high densities both in the UV and in the visual spectral region.

In the most straightforward embodiment of the present invention the ink jet image is directly used as master for the exposure of a printing plate or a PCB precursor. Alternatively, the ink jet image can be transformed into a mirror image by copying it on a duplicating material, preferably a photographic contact film. Preferred photographic contact films are so-called Daylight films, such as those manufactured by Agfa-Gevaert N.V., which can be handled in UV-poor office light. The duplicate image is then used in the subsequent exposure step.

The present invention will now be illustrated by the following examples without however being limited thereto.

EXAMPLES

Example 1

This example illustrates the fact that with the receiver elements used in accordance with the present invention high UV densities can be reached when applying a pigmented ink.

The following receiver samples were coated on a subbed polyethylene terephthalate support:

Receiver 1

Layer 1 and 2 were coated together using a slide hopper coater. The first layer, closest to the support, had a wet coating thickness of 100 μm, the second layer of 20 μm. The layers were dried at 50° C.

Comparison 1

Layer 3 was coated using a slide hopper coater. The layer had a wet thickness of 100 μm, and was dried at 50° C.

The layer compositions are summarized in table 1.

TABLE 1

| product (conc. wt %) | layer 1 | layer 2 | layer 3 |
| --- | --- | --- | --- |
| gelatin (K16096, Koepf) | 54 g | 45 g | — |
| PVP K90 (5%, BASF) | 272 ml | 224 ml | — |
| Mowiol 1074 (10%, Hoechst)* | — | — | 800 ml |
| water | up to 1 l | up to 1 l | up to 1 l |

*polyvinyl alcohol type

The different ink jet receiving elements were printed (full areas) with the genuine ink cartridges of three different printers, being a pigmented black ink, based on carbon black, in case of HP850, a black mixture of dyes in case of Epson 800, and also a black mixture of dyes in case of Canon 610. The printing experiments were performed at ambient temperature and 50% RH. The optical density (UV) was measured on a MacBeth TD904 one day after printing. The OD results are summarized in Table 2.

TABLE 2

| | HP850C | Epson 800 | Canon 610 |
| --- | --- | --- | --- |
| Receiver 1 | 4.0 | 1.3 | 1.3 |
| Comparison 1 | 0.2 | 1.7 | 1.3 |

The table shows that only the example printed with the pigmented ink of HP850C gives an optical tranmission density (UV) higher than 3.5. When printing with a black mixture of dyes like it is the case with Epson 800 and Canon 610 the optical density (UV) is lower than 3.5.

When printing with a pigmented black ink (HP850C) on a receiver containing another binder than a n-containing polymer the optical density (UV) is very low.

What is claimed is:

1. Method for the production of a UV sensitive printing plate comprising exposing said plate through a screened image, or through an intermediate itself exposed through said screened image, said image having a full area transmission Dmax of at least 3.5 in the ultra-violet spectral region, characterized in that said screened image has been obtained by jetting information-wise a liquid ink composition containing a UV absorbing pigment to a receiver element, said element comprising a transparent support and a receiving layer having as binder at least one N-containing polymer.

2. Method according to claim 1 wherein said N-containing polymer is gelatin.

3. Method according to claim 2 wherein said receiving layer further contains polyvinyl pyrrolidone as second binder.

4. Method according to claim 1 wherein said receiving layer further contains a spacing agent.

5. Method according to claim 4 wherein said spacing agent is a starch ester containing hydrophobic groups.

6. Method according to claim 1 wherein the receiving layer is a double layer.

7. Method according to claim 1 wherein wherein said liquid ink composition is an aqueous ink composition.

8. Method according to claim 1 wherein said pigment present in said ink composition is carbon black.

9. Method according to claim 1 wherein said liquid ink composition further comprises a UV-absorbing dye.

10. Method according to claim 1 wherein said intermediate has been obtained by exposing through said screened image a photographic contact film and processing said film.

11. Method for the production of a printed circuit board precursor comprising exposing said precursor though a line image consisting of lines having a density of at least 3.5 in the ultra-violet spectral region, characterized in that said image has been obtained by jetting information-wise a liquid ink composition containing a pigment to a receiver element, said element comprising a transparent support and a receiving layer having as binder at least one N-containing polymer.

12. Method for the recording of stored seismographic data as a line pattern by means of ink jet, said method comprising jetting information-wise a liquid ink composition containing pigment to a receiver element, said element comprising a transparent support and a receiving layer comprising a binder consisting essentially of N-containing polymer.

13. Method for the recording of stored seismographic data as a line pattern by means of ink jet, said method comprising jetting information-wise a liquid ink composition containing pigment to a receiver element, said element comprising a transparent support and a receiving layer comprising a binder wherein said binder comprises gelatin.

14. The method for the recording of stored seismographic data of claim 13 wherein said binder further comprises polyvinyl pyrrolidone.

15. The method for the recording of stored seismographic data of claim 13 comprising 60–100%, by weight, gelatin and 0–40%, by weight polyvinyl pyrrolidone.

16. Method for the recording of stored seismographic data as a line pattern by means of ink jet, said method comprising jetting information-wise a liquid ink composition containing pigment to a receiver element, said element comprising a transparent support and a receiveing layer having a water soluble binder comprising at least one N-containing polymer.

* * * * *

UNITED STATES PATENT AND TRADEMARK OFFICE
CERTIFICATE OF CORRECTION

PATENT NO.    : 6,460,957 B1                                              Page 1 of 1
DATED         : October 8, 2002
INVENTOR(S)   : Dirk Cyriel Quintens, Leo Oelbrandt and Marc Graindourze It is certified that error appears in the above-identified patent and that said Letters Patent is hereby corrected as shown below:

<u>Title page,</u>
Item [30], Foreign Application Priority Data, change "Aug. 10, 1998" to
-- October 8, 1998 --.

Signed and Sealed this

Eleventh Day of May, 2004

JON W. DUDAS
*Acting Director of the United States Patent and Trademark Office*